United States Patent
Shih et al.

(10) Patent No.: US 9,508,676 B1
(45) Date of Patent: Nov. 29, 2016

(54) SEMICONDUCTOR PACKAGE STRUCTURE HAVING HOLLOW CHAMBER AND BOTTOM SUBSTRATE AND PACKAGE PROCESS THEREOF

(71) Applicant: CHIPBOND TECHNOLOGY CORPORATION, Hsinchu (TW)

(72) Inventors: Cheng-Hung Shih, Changhua County (TW); Yung-Wei Hsieh, Hsinchu (TW); Shu-Chen Lin, Pingtung County (TW); Fu-Yen Ho, Hsinchu County (TW); Yen-Ting Chen, Hsinchu (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 14/848,439

(22) Filed: Sep. 9, 2015

(30) Foreign Application Priority Data

Aug. 10, 2015 (TW) .................................. 104125879

(51) Int. Cl.
*H01L 23/00* (2006.01)

(52) U.S. Cl.
CPC .............. *H01L 24/83* (2013.01); *H01L 24/13* (2013.01); *H01L 24/14* (2013.01); *H01L 24/16* (2013.01); *H01L 2224/13005* (2013.01); *H01L 2224/13014* (2013.01); *H01L 2224/14179* (2013.01); *H01L 2224/16245* (2013.01);
(Continued)

(58) Field of Classification Search
CPC ....... H01L 24/83; H01L 24/16; H01L 24/14; H01L 24/13; H01L 2224/13005; H01L 2224/14179; H01L 2224/13014; H01L 2924/1461; H01L 2224/83815; H01L 2224/16245; H01L 2924/014
See application file for complete search history.

(56) References Cited

U.S. PATENT DOCUMENTS

| 6,137,693 A * | 10/2000 | Schwiebert ........... H01L 23/057 228/180.1 |
| 2012/0145439 A1* | 6/2012 | Wen ...................... H05K 1/0215 174/257 |

FOREIGN PATENT DOCUMENTS

| EP | 2698819 A1 | 2/2014 | |
| JP | 2001-135775 | * 5/2001 | ............. H01L 25/04 |

(Continued)

OTHER PUBLICATIONS

Singaporean Office Action mailed Jan. 22, 2016 for Singaporean Patent Application No. 10201507864V, 10 pages.
(Continued)

*Primary Examiner* — Roy Potter
*Assistant Examiner* — Paul Patton
(74) *Attorney, Agent, or Firm* — Jackson IPG PLLC; Demian K. Jackson

(57) ABSTRACT

A semiconductor package structure having hollow chamber includes a bottom substrate having a bottom baseboard and a bottom metal layer formed on a disposing area of the bottom baseboard, a connection layer formed on the bottom metal layer, and a top substrate. The bottom metal layer has at least one corner having a first and a second outer lateral surface, and an outer connection surface. A first extension line is formed from a first extreme point of the first outer lateral surface, and a second extension line is formed from a second extreme point of the second outer lateral surface. A first exposing area of the bottom baseboard is formed by connecting the first and second extreme points and a cross point of the first and second extreme points. The top substrate connects to the connection layer to form a hollow chamber between the top and bottom substrates.

17 Claims, 10 Drawing Sheets

(52) U.S. Cl.
CPC ............... *H01L 2224/83815* (2013.01); *H01L 2924/014* (2013.01); *H01L 2924/1461* (2013.01)

(56) References Cited

FOREIGN PATENT DOCUMENTS

| | | |
|---|---|---|
| JP | 2008-218837 A | 9/2008 |
| JP | 2010-003763 A | 1/2010 |
| JP | 2013-541850 A | 11/2013 |
| JP | 2014-216403 A | 11/2014 |
| JP | 2015-109353 A | 6/2015 |
| TW | 201513272 A | 4/2015 |
| TW | M517908 | 2/2016 |
| WO | 2004/070836 A1 | 8/2004 |
| WO | 2014/115929 A1 | 7/2014 |

OTHER PUBLICATIONS

Japanese Office Action mailed Jul. 20, 2016 for Japanese Patent Application No. 2015-177645, 5 pages.
Korean Notice of Allowance mailed Aug. 25, 2016 for Korean Patent Application No. 10-2015-0128719, 2 pages.
Taiwanese Office Action mailed Aug. 22, 2016 for Taiwanese Patent Application No. 104125879, 8 pages.

\* cited by examiner

SEMICONDUCTOR PACKAGE STRUCTURE HAVING HOLLOW CHAMBER AND BOTTOM SUBSTRATE AND PACKAGE PROCESS THEREOF

FIELD OF THE INVENTION

The present invention generally relates to a semiconductor package structure, particularly represents the semiconductor package structure having hollow chamber.

BACKGROUND OF THE INVENTION

Conventional micro-electromechanical system (MEMS) package technology is performed as following: forming a connection portion on a substrate; disposing electronic components (such as resistor, transistor, radio frequency apparatus, integrated circuit or capacitor) on the substrate; coating a solder paste on the connection portion of the substrate by way of screen printing; disposing a cover on the connection portion and packaging by thermal compression to form a hollow chamber between the substrate and the cover. The electronic components can operate steadily in the hollow chamber. The conventional substrate incapable of fine-pitch package due to screen printing process requires larger area for solder paste coating, therefore, fine-pitch substrate development for shrinking package size is essential in MEMS package technology.

SUMMARY

The primary object of the present invention is that a connection layer is formed on a bottom metal layer of a bottom substrate by reflowing solder balls, and a top substrate connects to the bottom substrate via the connection layer. The bottom metal layer with particular corner is able to prevent overflow or undulating surface of the connection layer in formation process, furthermore prevent pollution because of overflow and enhance surface coplanarity of the connection layer.

A semiconductor package structure having hollow chamber of the present invention includes a bottom substrate, a connection layer and a top substrate. The bottom substrate comprises a bottom baseboard and a bottom metal layer, wherein the bottom baseboard comprises a surface having a disposing area, at least one first exposing area and a second exposing area. The disposing area is a closed loop and surrounds the second exposing area. The bottom metal layer is formed on the disposing area and comprises at least one corner having a first outer lateral surface, a second outer lateral surface and an outer connection surface located between the first outer lateral surface and the second outer lateral surface, wherein the outer connection surface connects the first outer lateral surface and the second outer lateral surface. The first outer lateral surface comprises a first bottom edge having a first extreme point, and a first extension line is formed extendedly from the first extreme point. The second outer lateral surface comprises a second bottom edge having a second extreme point, and a second extension line is formed extendedly from the second extreme point, wherein a cross point is formed by crossing the first extension line and the second extension line, and the first exposing area is defined by connecting the cross point, the first extreme point and the second extreme point. The connection layer is formed on the bottom metal layer. The top substrate comprises a connection surface, wherein the connection surface connects to the connection layer to form a hollow chamber between the top substrate and the bottom substrate.

In this invention, the top substrate connects to the bottom substrate via the connection layer formed by reflowing solder balls to form the sealed hollow chamber for accommodating an electronic component. Besides, use solder ball reflowing process to reduce the width of the bottom metal layer and further shrink the size of the semiconductor package structure having hollow chamber. And the corner of the bottom metal layer is able to prevent pollution problems result from overflow of the connection layer, or inadequate adaptation result from inadequate coplanarity of the connection layer, therefore, it is able to improve the yield rate of the semiconductor package structure having hollow chamber.

DETAILED DESCRIPTION OF THE INVENTION

Figure 1:
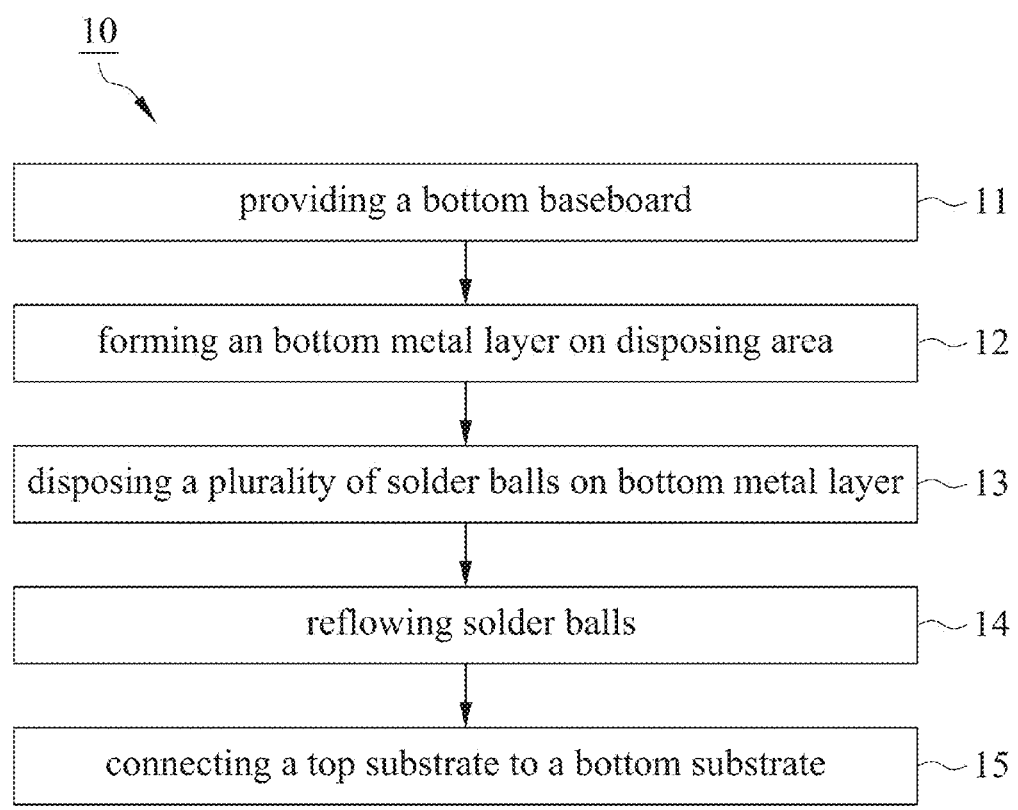
FIG. 1 is a flow chart illustrating a package process of semiconductor package structure having hollow chamber in accordance with a first embodiment of the present invention.

A flow chart of a package process of semiconductor package structure having hollow chamber 10 in accordance with a first embodiment of the present invention is illustrated in FIG. 1, the package process of semiconductor package structure having hollow chamber 10 includes step 11 of providing a bottom baseboard, step 12 of forming an bottom metal layer on disposing area, step 13 of disposing a plurality of solder balls on bottom metal layer, step 14 of reflowing solder balls, and step 15 of connecting a top substrate to a bottom substrate.

Figure 2:
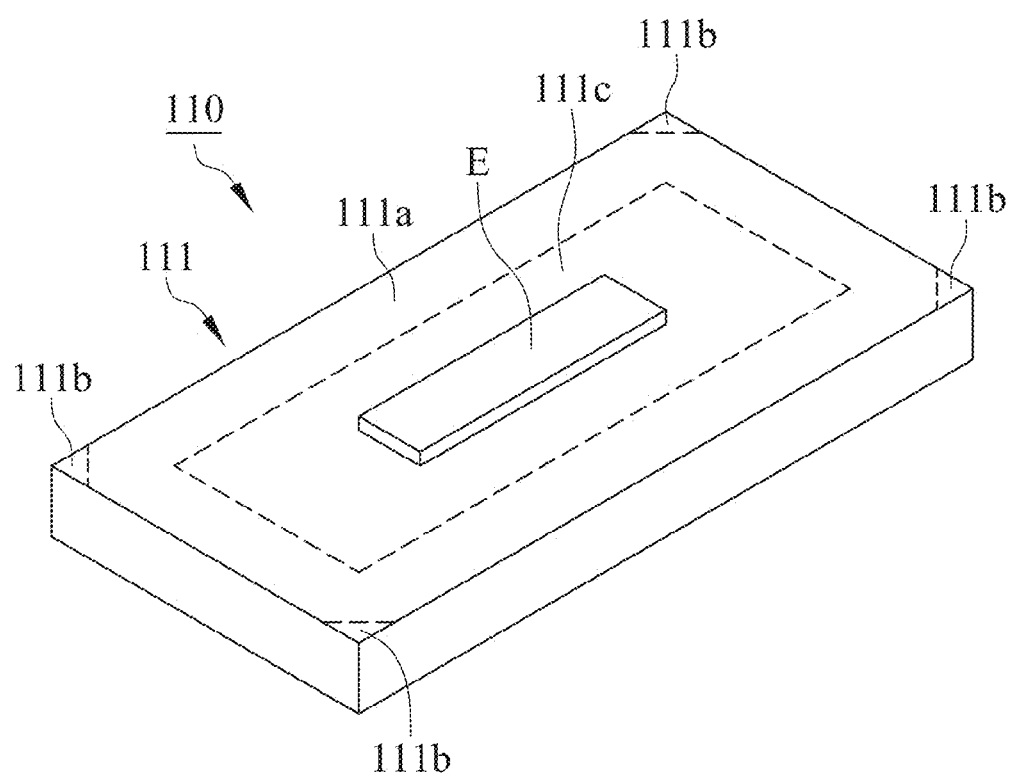
FIG. 2 is a perspective diagram illustrating a bottom baseboard in accordance with the first embodiment of the present invention.

With reference to FIGS. 1 and 2, in the step 11 of providing a bottom baseboard 110, the bottom baseboard 110 is selected from one of silicone, ceramic, glass, metal, polymer or other semiconductor materials. Referring to FIG. 2, the bottom baseboard 110 comprises a surface 111 having a disposing area 111a, at least one first exposing area 111b and a second exposing area 111c, wherein the disposing area 111a is a closed loop and surrounds the second exposing area 111c. An electronic component E is disposed on the second exposing area 111c.

Figure 3:
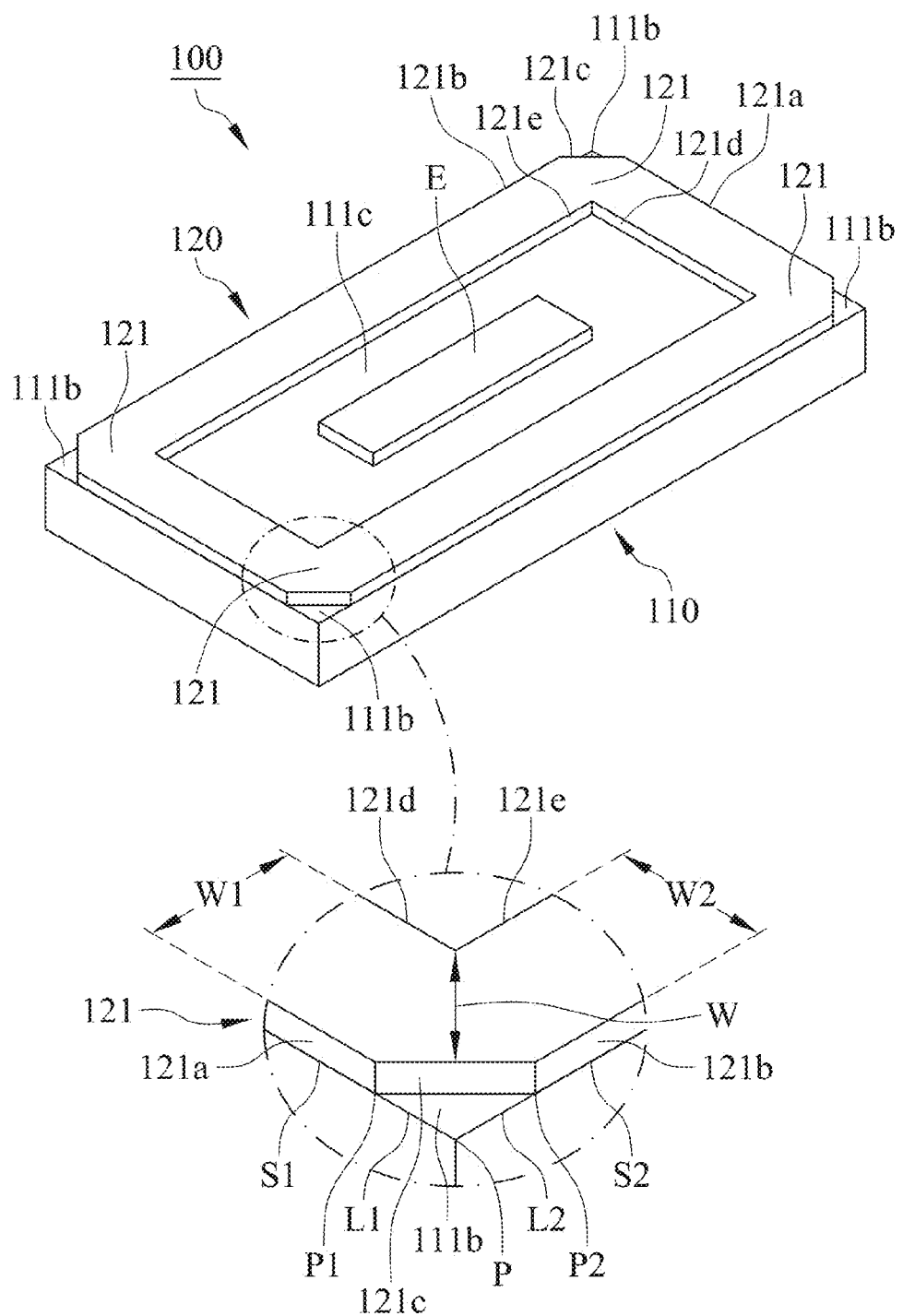
FIG. 3 is a perspective diagram illustrating a bottom substrate in accordance with the first embodiment of the present invention.

With reference to FIGS. 1 and 3, in the step 12 of forming a bottom metal layer 120 on the disposing area 111a, a bottom substrate 100 is composed of the bottom baseboard 110 and the bottom metal layer 120. In this embodiment, the bottom metal layer 120 is formed on the disposing area 111a by conventional photolithography process and electroplating/chemical plating process, and the bottom metal layer 120 is a multilayer metal structure or alloy used for adhesion, moisture and barrier, wherein material of the bottom metal layer 120 includes Titanium (Ti), Titanium/Wolfram (Ti/W), Copper (Cu), Chromium (Cr) and Nickel/Vanadium (Ni/V).

With reference to FIG. 3, the bottom metal layer 120 comprises at least one corner 121, and the bottom metal layer 120 comprises four corners 121 in this embodiment. The corner 121 comprises a first outer lateral surface 121a, a second outer lateral surface 121b and an outer connection surface 121c located between the first outer lateral surface 121a and the second outer lateral surface 121b, wherein the outer connection surface 121c connects the first outer lateral surface 121a and the second outer lateral surface 121b. The outer connection surface 121c is planar or curved, and the outer connection surface 121c is planar in this embodiment. The first outer lateral surface 121a comprises a first bottom edge S1 having a first extreme point P1, and a first extension line L1 is formed extendedly from the first extreme point P1. The second outer lateral surface 121b comprises a second bottom edge S2 having a second extreme point P2, and a second extension line L2 is formed extendedly from the second extreme point P2, wherein a cross point P is formed by crossing the first extension line L1 and the second extension line L2, and the first exposing area 111b is defined by connecting the cross point P, the first extreme point P1 and the second extreme point P2. In this embodiment, the surface 111 of the bottom baseboard 110 relative to the corner 121 of the bottom metal layer 120 comprises four first exposing areas 111b.

With reference to FIG. 3, in this embodiment, the corner 121 of the bottom metal layer 120 further comprises a first inner lateral surface 121d opposite to the first outer lateral surface 121a and a second inner lateral surface 121e opposite to the second outer lateral surface 121b, wherein the first inner lateral surface 121d and the second inner lateral surface 121e face toward the second exposing area 111c. Preferably, the first inner lateral surface 121d is substantially parallel to the first outer lateral surface 121a, and the second inner lateral surface 121e is substantially parallel to the second outer lateral surface 121b. A first width W1 is defined between the first outer lateral surface 121a and the first inner lateral surface 121d, wherein the first width W1 is the shortest distance between the first outer lateral surface 121a and the first inner lateral surface 121d. A second width W2 is defined between the second outer lateral surface 121b and the second inner lateral surface 121e, wherein the second width W2 is the shortest distance between the second outer lateral surface 121b and the second inner lateral surface 121e. In this embodiment, the first width W1 is substantially equal to the second width W2, and both of the first width W1 and the second width W2 are between 150 μm and 400 μm. A connection width W is defined between edge of the second exposing area 111c and the outer connection surface 121c, wherein the connection width W is the shortest distance between edge of the second exposing area 111c and the outer connection surface 121c. In this embodiment, the ratio of the first width W1 to the connection width W is 1:0.8 to 1:1.4, and the ratio of the second width W2 to the connection width W is also 1:0.8 to 1:1.4.

Figure 4:
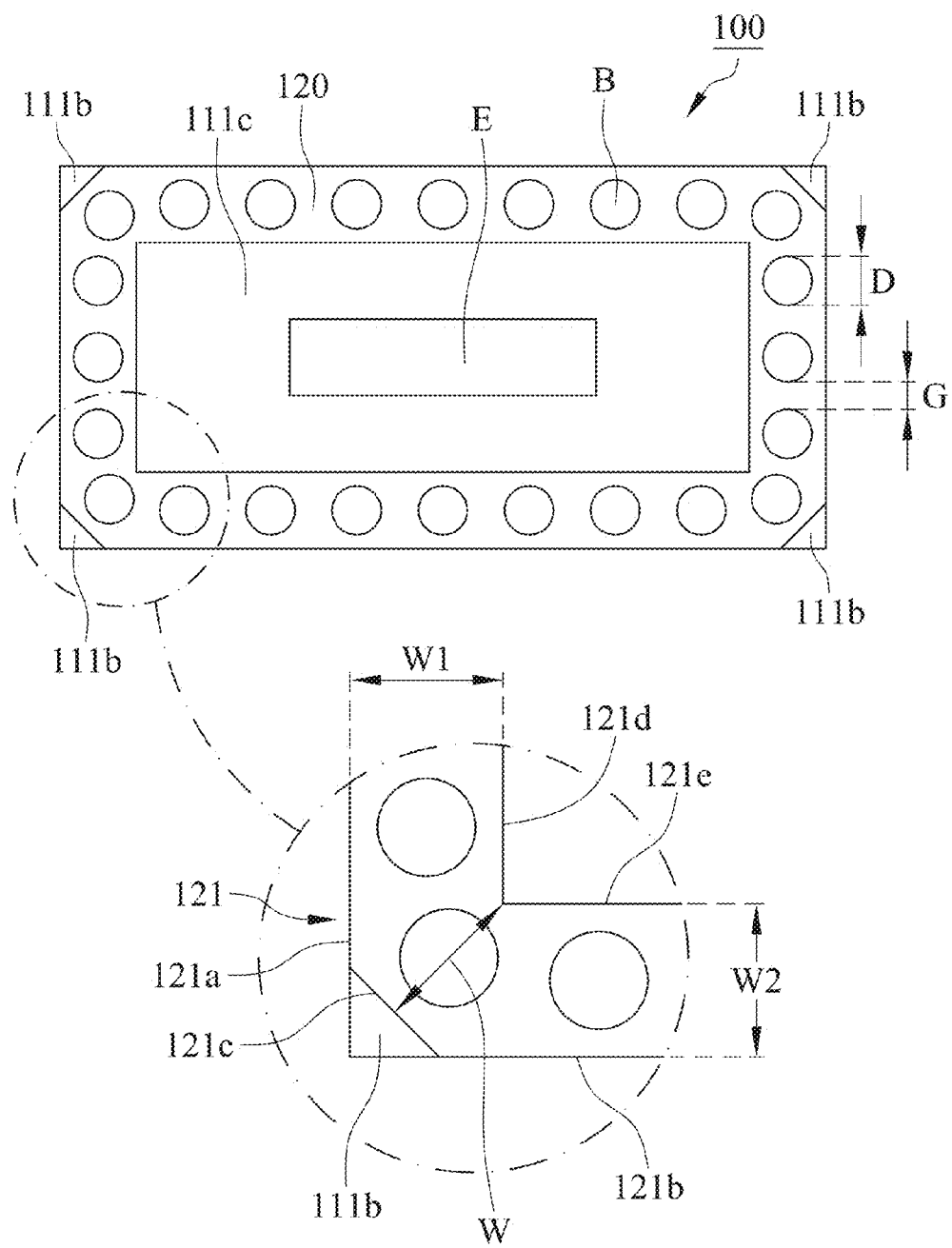
FIG. 4 is a diagram illustrating the package process of semiconductor package structure having hollow chamber in accordance with the first embodiment of the present invention.
Figure 5:
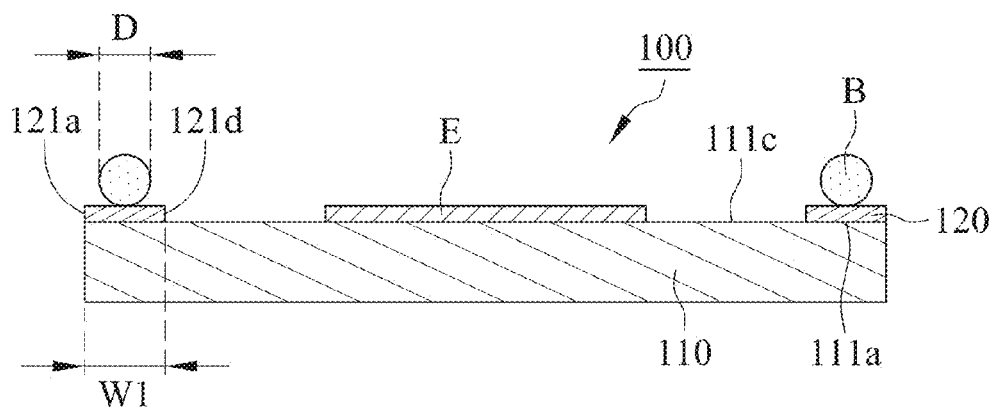
FIG. 5 is a diagram illustrating the package process of semiconductor package structure having hollow chamber in accordance with the first embodiment of the present invention.

With reference to FIGS. 1, 4 and 5, in the step 13 of disposing a plurality of solder balls B on the bottom metal layer 120, each of the solder balls B has a diameter D and there is a spacing G between two adjacent solder balls B, wherein the spacing G is not smaller than half of the diameter D of the solder balls B to prevent position deviation of the solder balls B result from collision between two adjacent solder balls B. Besides, if the spacing G between two adjacent solder balls B is too large, a gap between two adjacent solder balls B may be formed after reflow because that two adjacent solder balls B might be unable to connect mutually. In this embodiment, the ratio of the diameter D of the solder balls B to the spacing G between two adjacent solder balls B is 1:0.5 to 1:3. Preferably, the solder balls B are selected from one of Tin (Sn), Bismuth (Bi), Indium (In), Gold/Tin (Au/Sn), Tin/Silver (Sn/Ag), Tin/Copper (Sn/Cu), Ti/Bismuth (Sn/Bi), Ti/Silver/Copper (Sn/Ag/Cu), Ti/Silver/Bismuth (Sn/Ag/Bi) or Tin/Silver/Copper/Antimony (Sn/Ag/Cu/Sb) lead-free solder material.

Figure 6:
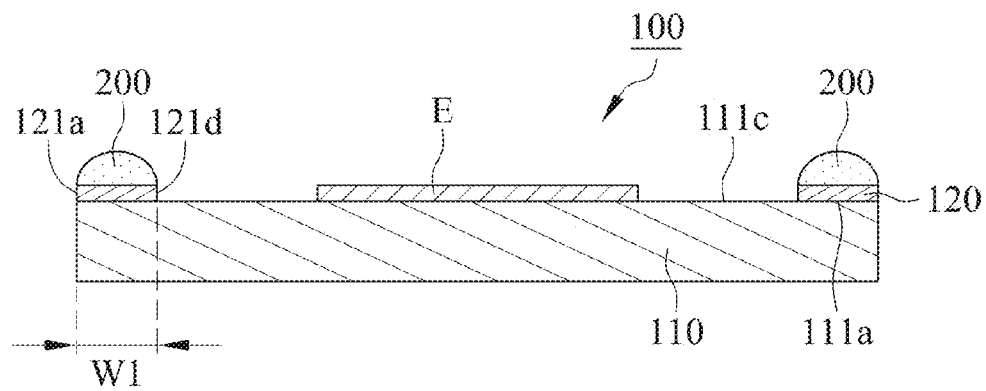
FIG. 6 is a diagram illustrating the package process of semiconductor package structure having hollow chamber in accordance with the first embodiment of the present invention.

With reference to FIGS. 1 and 6, in the step 14 of reflowing the solder balls B, the solder balls B are melted and connect mutually to form a connection layer 200 on the bottom metal layer 120, wherein the connection layer 200 forms a spherical-shaped surface because of surface tension. In this embodiment, the connection layer 200 completely covers the surface of the bottom metal layer 120. Reflow temperature depends on the melting point of the solder balls B, preferably, reflow temperature is 0 to 80 degrees higher than the melting point of the solder balls B to ensure the solder balls B melted completely in the reflow process. Besides, the connection layer 200 formed after reflow process possible overflows from the bottom metal layer 120 to pollute the electronic component E or the package structure when the solder balls B are oversize. Conversely, the connection layer 200 formed after reflow process may be unable to cover the bottom metal layer 120 completely when the solder balls B are too small. With reference to FIG. 5, in this embodiment, the ratio of the diameter D of the solder balls B to the first width W1 is 1:0.5 to 1:3 for preventing overflow or incomplete covering.

Figure 7:
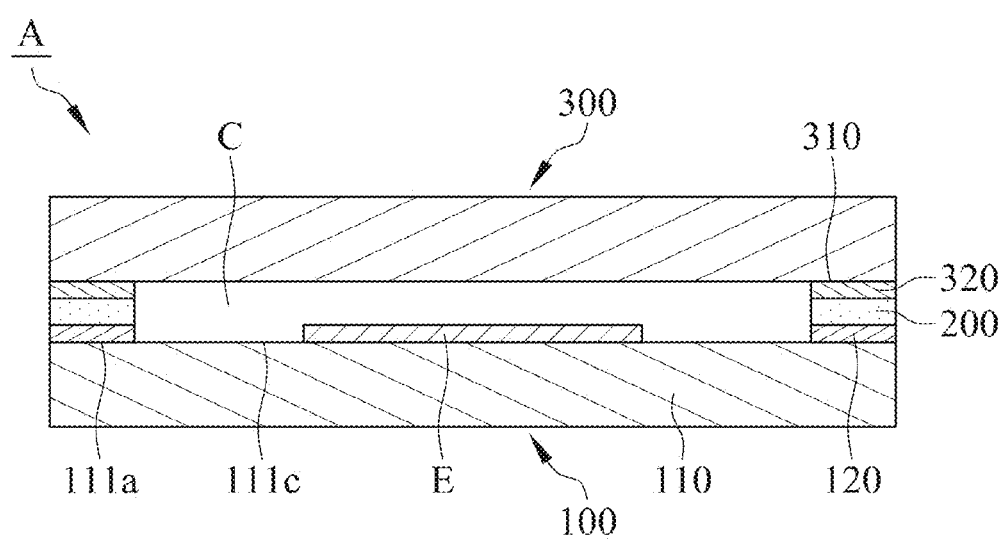
FIG. 7 is a diagram illustrating the package process of semiconductor package structure having hollow chamber in accordance with the first embodiment of the present invention.

With reference to FIGS. 1 and 7, in the step 15 of connecting a top substrate 300 to the bottom substrate 100, preferably, the top substrate 300 connects to the bottom substrate 100 by reflow process or thermal compression. The top substrate 300 comprises a joint surface 310 connected with the connection layer 200 for forming a hollow chamber C between the top substrate 300 and the bottom substrate 100. The hollow chamber C is used to accommodate the electronic component E for external insulation and stability enhancement. In this embodiment, the top substrate 300 comprises a top metal layer 320 formed on the joint surface 310, therefore, the joint surface 310 of the top substrate 300 connects with the connection layer 200 via the top metal layer 320 when the top substrate 300 connects to the bottom substrate 100. Material of the top metal layer 320 includes Titanium (Ti), Titanium/Tungsten (Ti/W), Copper (Cu), Chrome (Cr) and Nickel/Vanadium (Ni/V), wherein the top metal layer 320 is used for adhesion, moisture and barrier.

Because the connection layer 200 formed by reflowing the solder balls B has fine fluidity on the bottom metal layer 120, so the connection layer 200 is able to flow toward any direction to cover the bottom metal layer 120 completely. When the connection layer 200 flows toward the corner 121 of the bottom metal layer 120, the connection layer 200 maintains fine fluidity at the corner 121 by the outer connection surface 121c of the corner 121, to prevent the connection layer 200 from accumulating on the corner 121, enhance surface coplanarity of the connection layer 200, and further enhance the adaptation between the bottom substrate 100 and the top substrate 300.

Figure 8:
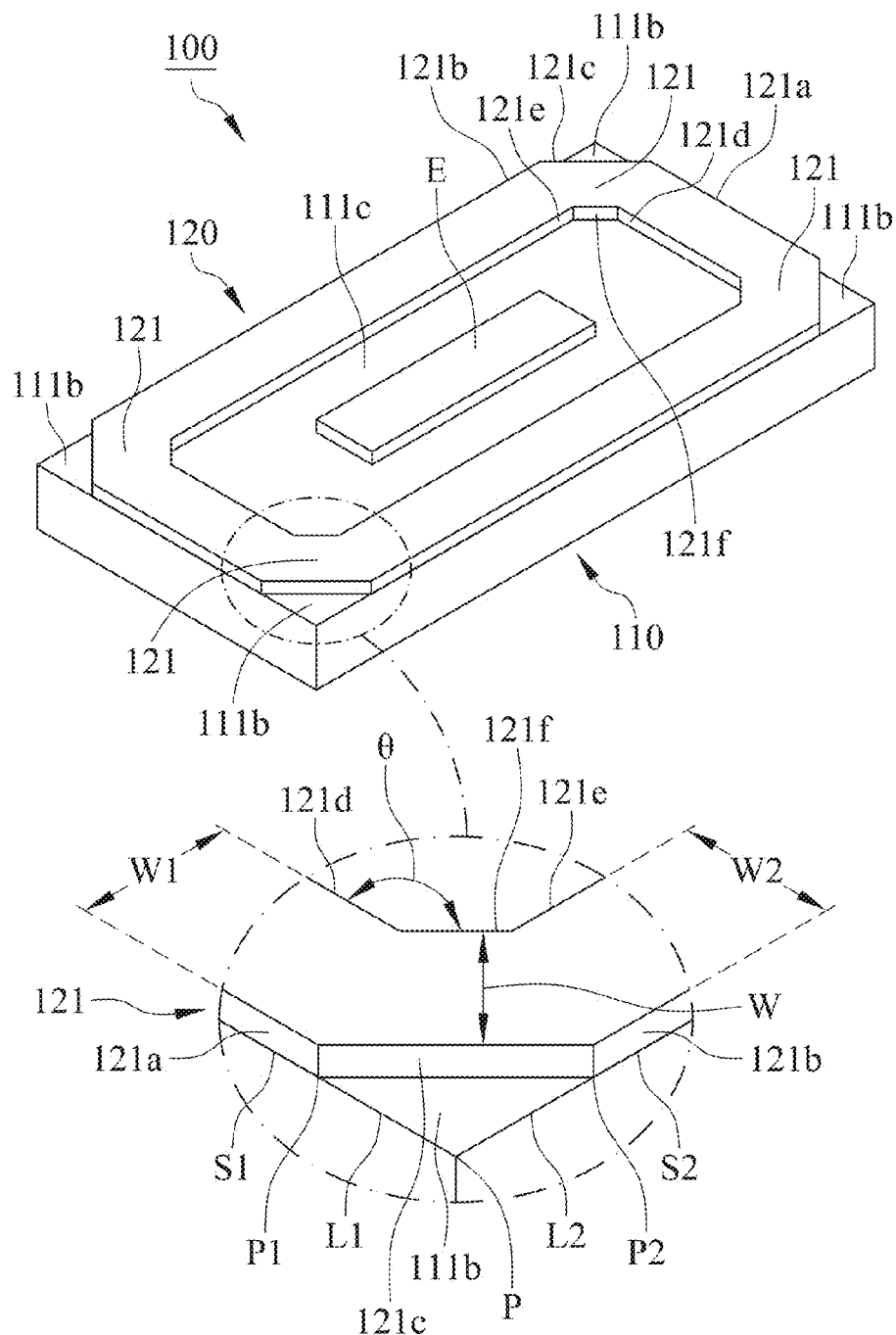
FIG. 8 is a perspective diagram illustrating a bottom substrate in accordance with a second embodiment of the present invention.

A second embodiment of the present invention is illustrated in FIG. 8, the primary difference between the first and second embodiments is that the corner 121 of the bottom metal layer 120 further comprises an inner connection surface 121f opposite to the outer connection surface 121c in the second embodiment, wherein the inner connection surface 121f connects and locates between the first inner lateral surface 121d and the second inner lateral surface 121e. The inner connection surface 121f is planar or curved, and the inner connection surface 121f is planar in this embodiment, and the inner connection surface 121f is substantially parallel to the outer connection surface 121c. The shortest distance between the inner connection surface 121f and the outer connection surface 121c is substantially equal to the connection width W (the shortest distance between edge of the second exposing area 111c and the outer connection surface 121c). An included angle θ is defined between the inner connection surface 121f and the first inner lateral surface 121d, wherein the included angle θ is smaller than 180 degrees. The connection width W is substantially equal to the first width W1 and the second width W2 because of the inner connection surface 121f, so the inner connection surface 121f is able to further enhance surface coplanarity of the connection layer 200.

Figure 9:
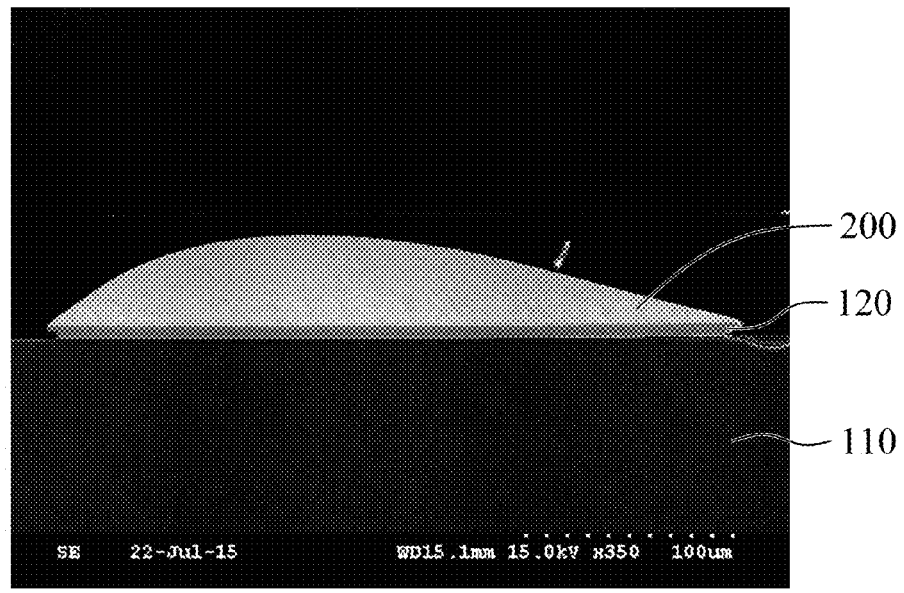
FIG. 9 is an SEM image of reference bottom substrate.

An SEM image of reference bottom substrate is illustrated in FIG. 9 used for showing height distribution of the connection layer 200 at diagonal position of the reference bottom substrate. The corner of reference bottom substrate does not possess the outer connection surface 121c and the inner connection surface 121f, therefore the corner of reference bottom substrate is right angle. With reference to FIG. 9, the connection layer 200 formed after reflow process accumulates at inside corner of reference bottom substrate, therefore a asymmetric structure of the connection layer 200 is formed at the corner of reference bottom substrate. The asymmetric connection layer will affect surface coplanarity of the connection layer 200 and adaptation of the substrate package.

Figure 10:
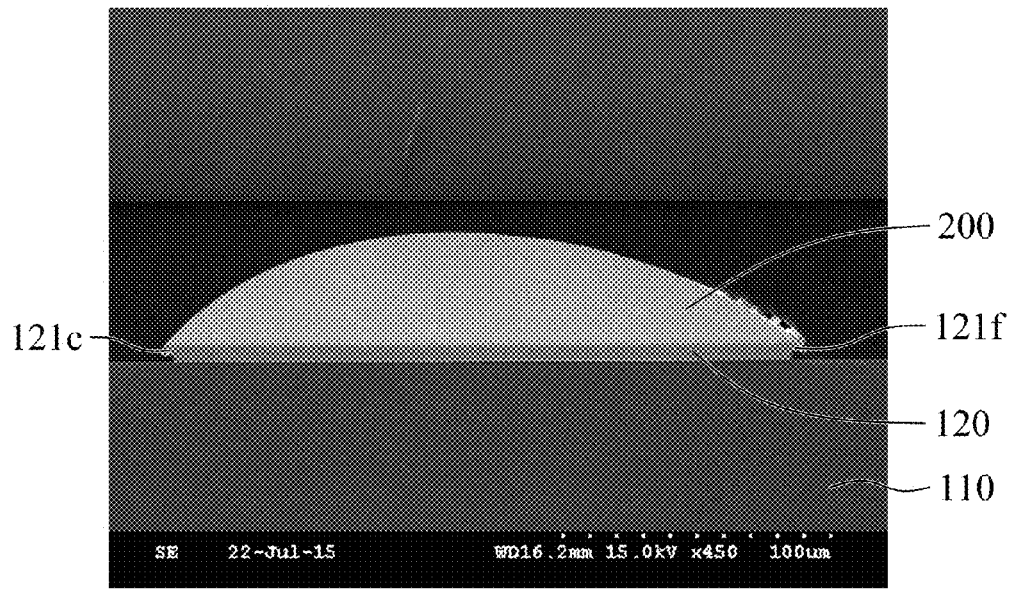
FIG. 10 is an SEM image of the bottom substrate in accordance with the second embodiment of the present invention.

An SEM image of the bottom substrate 100 of this embodiment is illustrated in FIG. 10 used for showing height distribution of the connection layer 200 at diagonal position of the bottom substrate 100. With reference to FIG. 10, the connection layer 200 formed after reflow process displays symmetric at the corner 121 of the bottom metal layer 120, to prove that the outer connection surface 121c and the inner connection surface 121f of the corner 121 is able to prevent accumulation of the connection layer 200, so the corner 121 is able to enhance coplanarity of the connection layer 200, and further enhance adaptation between the bottom substrate 100 and the top substrate 300. Coplanarity of the connection layer 200 of this embodiment is 1.7 um, and coplanarity of the connection layer 200 of reference bottom substrate is 10.2 um, it is clear to know that the outer connection surface 121c and the inner connection surface 121f of the present invention enables to enhance coplanarity of the connection layer 200 availably.

Figure 11:
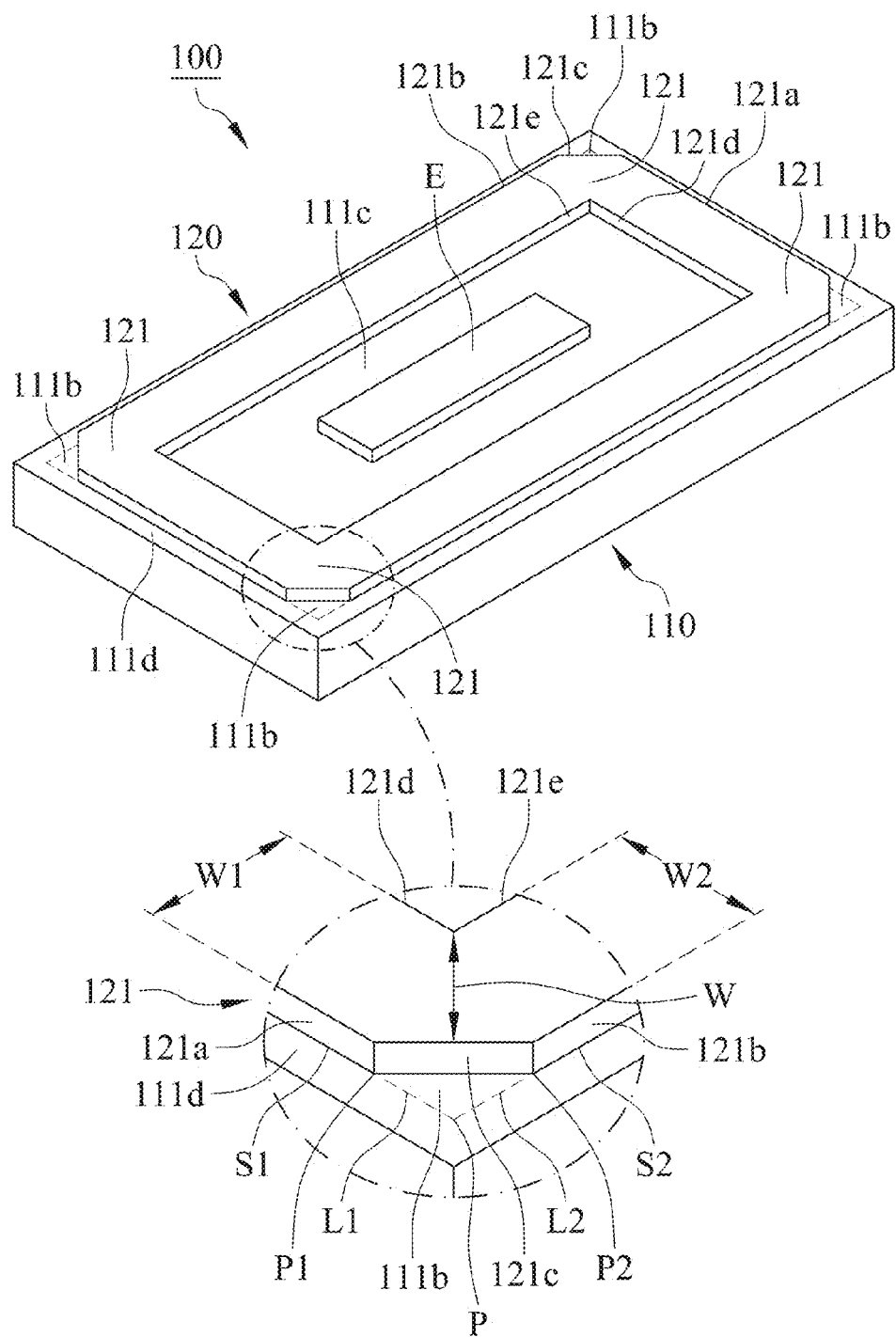
FIG. 11 is a perspective diagram illustrating a bottom substrate in accordance with a third embodiment of the present invention.

A third embodiment of the present invention is illustrated in FIG. 11, the difference between the first and the third embodiments is that the surface 111 of the bottom baseboard 110 further comprises a third exposing area 111d surrounding the disposing area 111a and the first exposing area 111b in the third embodiment, wherein the first exposing area 111b locates between the third exposing area 111d and the disposing area 111a. The third exposing area 111d is used to provide allowance to improve the yield rate in package process.

Figure 12:
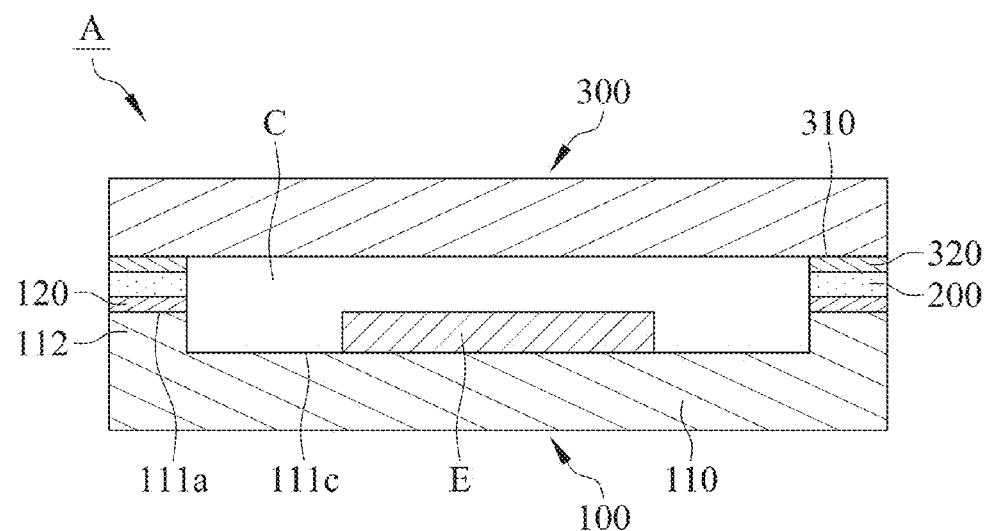
FIG. 12 is a section diagram illustrating the semiconductor package structure having hollow chamber in accordance with a fourth embodiment of the present invention.
Figure 13:
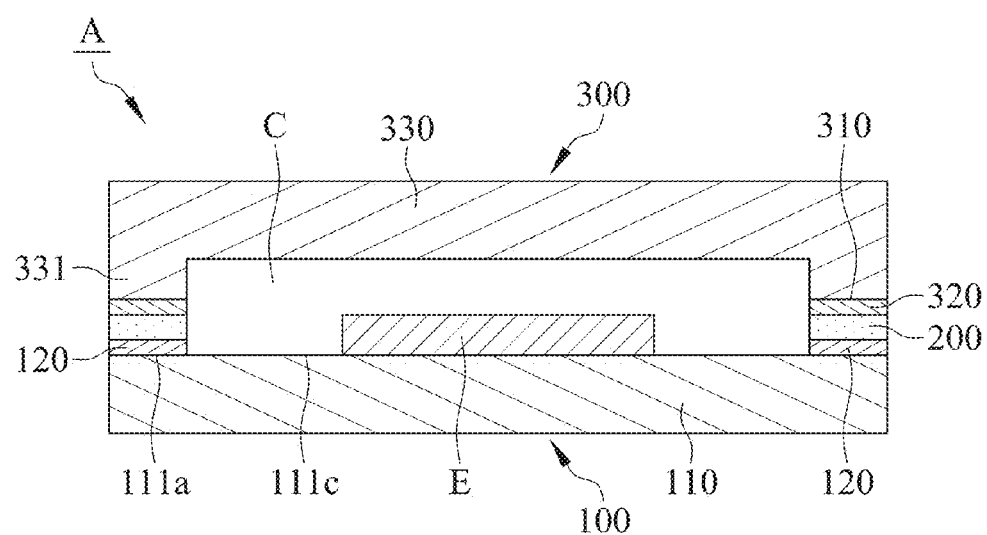
FIG. 13 is a section diagram illustrating the semiconductor package structure having hollow chamber in accordance with a fifth embodiment of the present invention.

A fourth embodiment of the present invention is illustrated in FIG. 12, the difference between the first and fourth embodiments is that the bottom baseboard 110 of the bottom substrate 100 further comprises a bottom protrusion portion 112 in the fourth embodiment, wherein the disposing area 111a and the first exposing area 111b are located on the surface of the bottom protrusion portion 112. A fifth embodiment of the present invention is illustrated in FIG. 13, the difference between the first and the fifth embodiments is that the top substrate 300 further comprises an top baseboard 330 having an top protrusion portion 331, wherein the joint surface 310 is the surface of the top protrusion portion 331. The height of the hollow chamber C increased by the bottom protrusion portion 112 of the fourth embodiment or the top protrusion portion 331 of the fifth embodiment is able to accommodate higher electronic component or vertical operation electronic component.

In the present invention, a semiconductor package structure A is formed by steps 11-15 of the package process, wherein the top substrate 300 connects to the bottom substrate 100 via the connection layer 200 formed by reflowing the solder balls B. Owing to the diameter D of the solder balls B is micrometer level, so the width of the bottom metal layer 120 and the size of the semiconductor package structure A having hollow chamber are able to be reduced effectively. And coplanarity of the connection layer 200 and adaptation between the top substrate 300 and the bottom substrate 100 are enhanced effectively by the outer connection surface 121c of the corner 121.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A semiconductor package structure having hollow chamber includes:
   a bottom substrate comprising a bottom baseboard defining a disposing area, at least one first exposed area and a second exposed area, wherein the disposing area is a closed loop and surrounds the second exposed area, and wherein a bottom metal layer is formed on the disposing area and comprises at least one corner having a first outer lateral surface, a second outer lateral surface and an outer connection surface located between and connecting the first outer lateral surface and the second outer lateral surface, wherein the first outer lateral surface comprises a first bottom edge having a first extreme point, a first extension line is formed extendedly from the first extreme point, and the second outer lateral surface comprises a second bottom edge having a second extreme point, a second extension line is formed extendedly from the second extreme point, wherein a cross point is formed by crossing the first extension line and the second extension line, and the at least one first exposed area is defined by connecting the cross point, the first extreme point and the second extreme point;

a connection layer formed from a plurality of reflowed solder balls on the bottom metal layer; and a top substrate having a joint surface, wherein the joint surface connects to the connection layer to form a hollow chamber between the top substrate and the bottom substrate.

2. The semiconductor package structure having hollow chamber in accordance with claim 1, wherein the corner of the bottom metal layer further comprises a first inner lateral surface opposite to the first outer lateral surface and a second inner lateral surface opposite to the second outer lateral surface, each facing toward the second exposed area, wherein a first width defined between the first outer lateral surface and the first inner lateral surface is the shortest distance between the first outer lateral surface and the first inner lateral surface, and a connection width defined between edge of the second exposed area and the outer connection surface is the shortest distance between edge of the second exposed area and the outer connection surface, wherein the ratio of the first width to the connection width is 1:0.8 to 1:1.4.

3. The semiconductor package structure having hollow chamber in accordance with claim 2, wherein the corner of the bottom metal layer further comprises an inner connection surface opposite to the outer connection surface, the inner connection surface connects and locates between the first inner lateral surface and the second inner lateral surface, wherein an included angle is defined between the inner connection surface and the first inner lateral surface, and the included angle is smaller than 180 degrees.

4. The semiconductor package structure having hollow chamber in accordance with claim 1, wherein the bottom baseboard further comprises a bottom protrusion portion, the disposing area and the at least one first exposed area are located on the bottom protrusion portion surface.

5. The semiconductor package structure having hollow chamber in accordance with claim 1, wherein the top substrate comprises a top metal layer formed on the joint surface of the top substrate, the joint surface connects to the connection layer via the top metal layer.

6. The semiconductor package structure having hollow chamber in accordance with claim 5, wherein the top substrate further comprises a top baseboard having a top protrusion portion, the joint surface is the top protrusion portion surface.

7. The semiconductor package structure having hollow chamber in accordance with claim 1, wherein the surface of the bottom baseboard further comprises a third exposed area surrounding the disposing area and the at least one first exposed area, the first exposed area is located between the third exposed area and the disposing area.

8. A package process of a semiconductor package structure having hollow chamber includes:

providing a bottom baseboard defining a disposing area, at least one first exposed area and a second exposed area, the disposing area is a closed loop and surrounds the second exposed area;

forming an bottom metal layer on the disposing area, wherein the bottom metal layer comprises a corner having a first outer lateral surface, a second outer lateral surface and an outer connection surface located between and connecting the first outer lateral surface and the second outer lateral surface, wherein the first outer lateral surface comprises a first bottom edge having a first extreme point, a first extension line is formed extendedly from the first extreme point, and the second outer lateral surface comprises a second bottom edge having a second extreme point, a second extension line is formed extendedly from the second extreme point, wherein a cross point is formed by crossing the first extension line and the second extension line, and the at least one first exposed area is defined by connecting the cross point, the first extreme point and the second extreme point, wherein a bottom substrate is composed of the bottom baseboard and the bottom metal layer;

disposing a plurality of solder balls on the bottom metal layer;

reflowing the solder balls for making the solder balls melt and connect mutually to form a connection layer on the bottom metal layer; and connecting a top substrate with a joint surface to the bottom substrate, wherein the joint surface connects to the connection layer to form a hollow chamber between the top substrate and the bottom substrate.

9. The package process of a semiconductor package structure having hollow chamber in accordance with claim 8, wherein the corner of the bottom metal layer further comprises a first inner lateral surface opposite to the first outer lateral surface and a second inner lateral surface opposite to the second outer lateral surface, each facing toward the second exposed area, wherein a first width defined between the first outer lateral surface and the first inner lateral surface is the shortest distance between the first outer lateral surface and the first inner lateral surface, and a connection width defined between edge of the second exposed area and the outer connection surface is the shortest distance between edge of the second exposed area and the outer connection surface, wherein the ratio of the first width to the connection width is 1:0.8 to 1:1.4.

10. The package process of a semiconductor package structure having hollow chamber in accordance with claim 9, wherein the corner of the bottom metal layer further comprises an inner connection surface opposite to the outer connection surface, the inner connection surface connects and locates between the first inner lateral surface and the second inner lateral surface, wherein an included angle is defined between the inner connection surface and the first inner lateral surface, and the included angle is smaller than 180 degrees.

11. The package process of a semiconductor package structure having hollow chamber in accordance with claim 9, wherein each of the solder balls comprises a diameter, the ratio of the diameter to the first width is 1:0.5 to 1:3.

12. The package process of a semiconductor package structure having hollow chamber in accordance with claim 8, wherein each of the solder balls comprises a diameter, and there is a spacing between two adjacent solder balls, the spacing is not smaller than half of the diameter of the solder balls.

13. The package process of a semiconductor package structure having hollow chamber in accordance with claim 12, wherein the ratio of the diameter of the solder balls to the spacing between two adjacent solder balls is 1:0.5 to 1:3.

14. The package process of a semiconductor package structure having hollow chamber in accordance with claim 8, wherein the bottom baseboard further comprises a bottom protrusion portion, the disposing area and the at least one first exposed area are located on the bottom protrusion portion surface.

15. The package process of a semiconductor package structure having hollow chamber in accordance with claim 8, wherein the top substrate further comprises a top metal layer formed on the joint surface of the top substrate, and the joint surface connects to the connection layer via the top metal layer.

16. The package process of a semiconductor package structure having hollow chamber in accordance with claim 15, wherein the top substrate further comprises a top baseboard having a top protrusion portion, the joint surface is the top protrusion portion surface.

17. The package process of a semiconductor package structure having hollow chamber in accordance with claim 8, wherein the surface of the bottom baseboard further comprises a third exposed area surrounding the disposing area and the at least one first exposed area, the at least one first exposed area is located between the third exposed area and the disposing area.

* * * * *